US009934998B2

(12) United States Patent
Han et al.

(10) Patent No.: US 9,934,998 B2
(45) Date of Patent: *Apr. 3, 2018

(54) SEMICONDUCTOR DEVICE AND METHOD OF SINGULATING THIN SEMICONDUCTOR WAFER ON CARRIER ALONG MODIFIED REGION WITHIN NON-ACTIVE REGION FORMED BY IRRADIATING ENERGY

(71) Applicant: STATS ChipPAC Pte. Ltd., Singapore (SG)

(72) Inventors: Byung Joon Han, Singapore (SG); Il Kwon Shim, Singapore (SG); Won Kyoung Choi, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/379,178

(22) Filed: Dec. 14, 2016

(65) Prior Publication Data

US 2017/0092529 A1    Mar. 30, 2017

Related U.S. Application Data

(63) Continuation of application No. 13/469,754, filed on May 11, 2012, now Pat. No. 9,559,004.

(Continued)

(51) Int. Cl.
| | |
|---|---|
| *H01L 21/00* | (2006.01) |
| *H01L 21/683* | (2006.01) |
| *H01L 23/544* | (2006.01) |
| *H01L 21/78* | (2006.01) |
| *H01L 23/00* | (2006.01) |
| *H01L 23/48* | (2006.01) |

(52) U.S. Cl.
CPC .......... *H01L 21/6836* (2013.01); *H01L 21/78* (2013.01); *H01L 23/481* (2013.01);
(Continued)

(58) Field of Classification Search
CPC .. H01L 21/6835; H01L 21/6836; H01L 21/78
See application file for complete search history.

(56) References Cited

U.S. PATENT DOCUMENTS

| | | |
|---|---|---|
| 5,701,666 A | 12/1997 | DeHaven et al. |
| 7,563,642 B2 | 7/2009 | Higashino |

(Continued)

*Primary Examiner* — Dale E. Page
*Assistant Examiner* — Wilner Jean Baptiste
(74) *Attorney, Agent, or Firm* — Brian M. Kaufman; Robert D. Atkins; Patent Law Group: Atkins and Associates, P.C.

(57) ABSTRACT

A semiconductor device comprises a carrier including an adhesive disposed over the carrier. The semiconductor device further comprises a semiconductor wafer including a plurality of semiconductor die separated by a non-active region. A plurality of bumps is formed over the semiconductor die. The semiconductor wafer is mounted to the carrier with the adhesive disposed around the plurality of bumps. Irradiated energy is applied to the non-active region to form a modified region within the non-active region. The semiconductor wafer is singulated along the modified region to separate the semiconductor die. The semiconductor wafer is singulated along the modified region by applying stress to the semiconductor wafer. The adhesive is removed from around the plurality of bumps after singulating the semiconductor wafer. The semiconductor wafer includes a plurality of semiconductor die comprising through silicon vias. The modified region optionally includes a plurality of vertically stacked modified regions.

13 Claims, 20 Drawing Sheets

Related U.S. Application Data

(60) Provisional application No. 61/485,545, filed on May 12, 2011.

(52) U.S. Cl.
CPC ............ *H01L 23/544* (2013.01); *H01L 24/13* (2013.01); *H01L 2221/6834* (2013.01); *H01L 2221/68327* (2013.01); *H01L 2221/68381* (2013.01); *H01L 2223/5446* (2013.01); *H01L 2224/13025* (2013.01)

(56) References Cited

U.S. PATENT DOCUMENTS

| | | |
|---|---|---|
| 7,776,649 B1 | 8/2010 | Fan |
| 7,807,507 B2 | 10/2010 | Kim et al. |
| 7,843,052 B1 | 11/2010 | Yoo et al. |
| 7,863,092 B1 | 1/2011 | Chaware et al. |
| 2002/0048906 A1 | 4/2002 | Sakai et al. |
| 2005/0142696 A1 | 6/2005 | Tsai |
| 2006/0087033 A1 | 4/2006 | Goh et al. |
| 2007/0155131 A1* | 7/2007 | Contes .................... H01L 21/78 438/458 |
| 2008/0036002 A1 | 2/2008 | Kishiro |
| 2008/0293218 A1 | 11/2008 | Nakamura |
| 2009/0081830 A1 | 3/2009 | Omandam et al. |
| 2010/0019397 A1 | 1/2010 | Youn et al. |
| 2010/0120229 A1 | 5/2010 | Nakamura et al. |
| 2010/0203678 A1 | 8/2010 | Fukumitsu et al. |
| 2010/0267199 A1 | 10/2010 | Harakeyama et al. |
| 2010/0326702 A1 | 12/2010 | Dang et al. |
| 2011/0034007 A1* | 2/2011 | Yodo ....................... H01L 21/78 438/463 |

\* cited by examiner

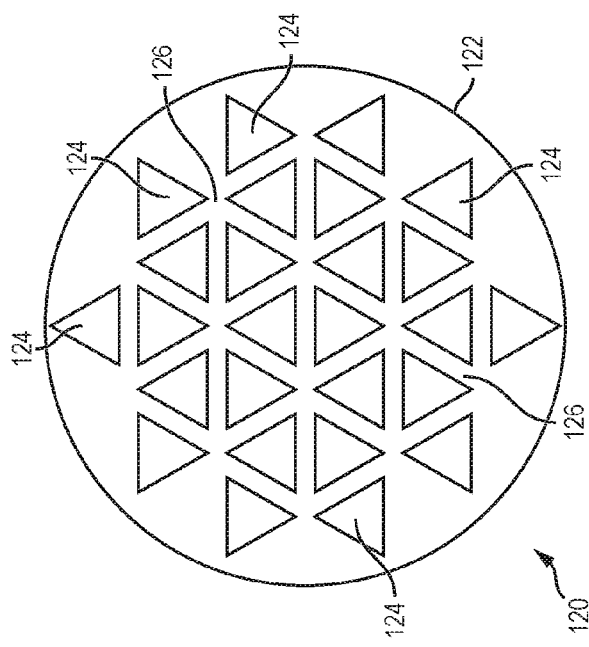
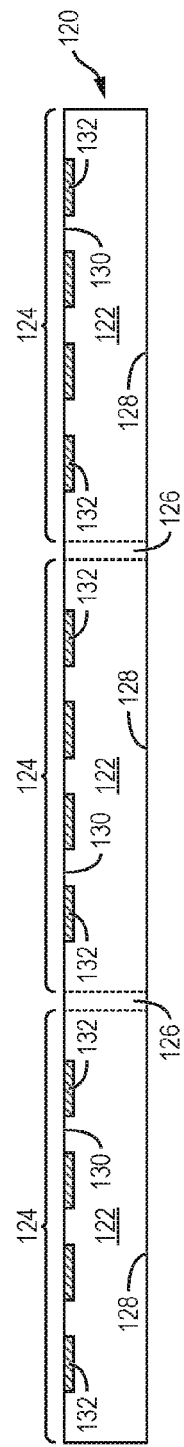
FIG. 3c
FIG. 3d

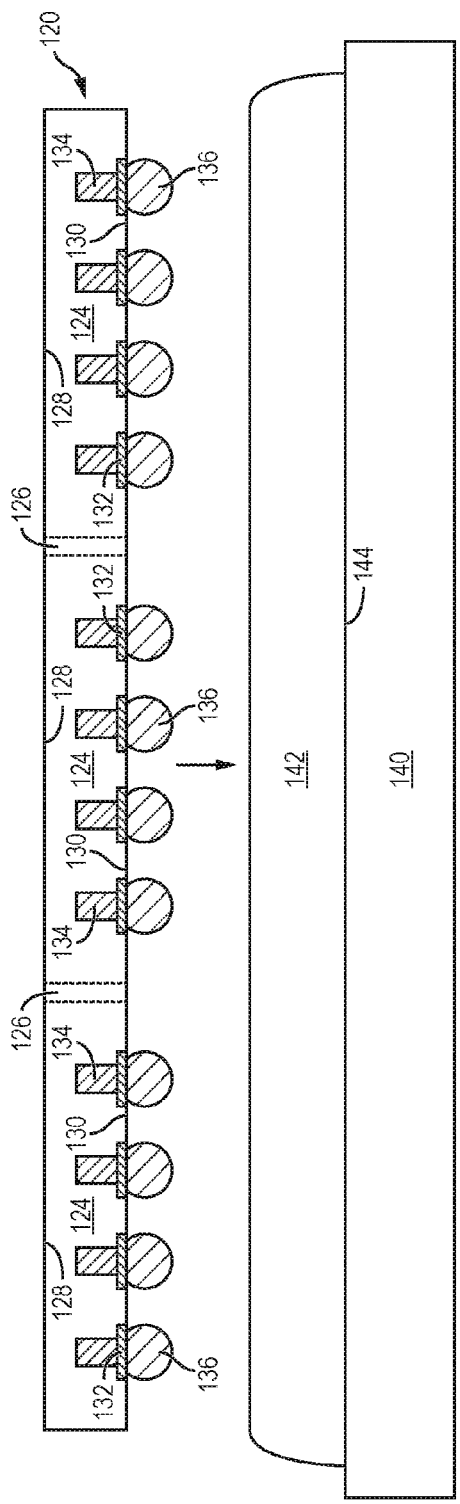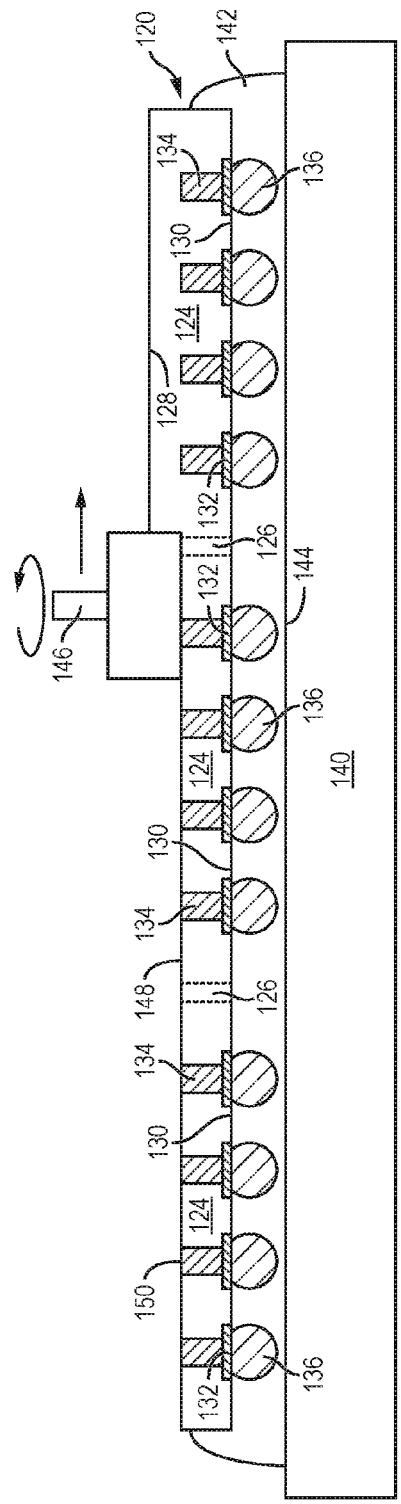

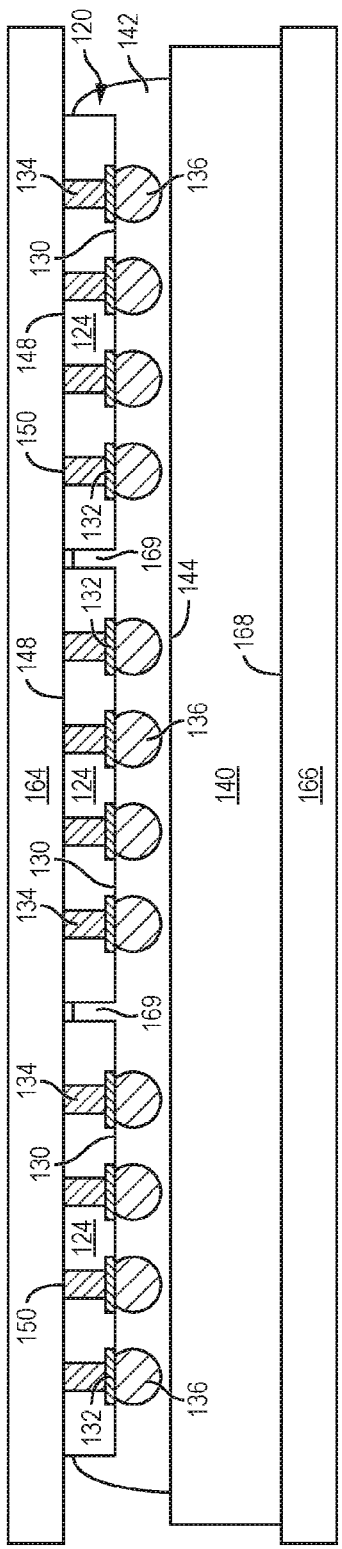
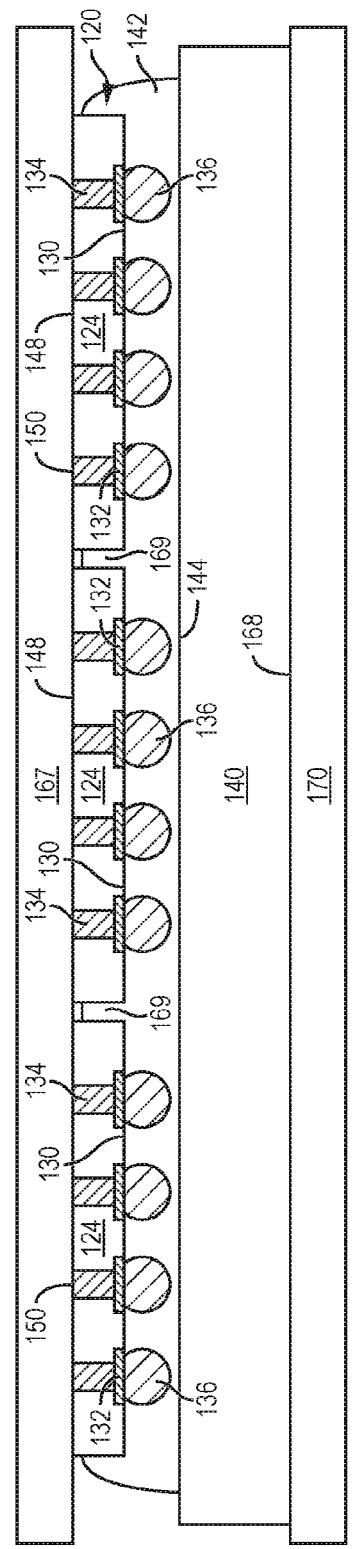

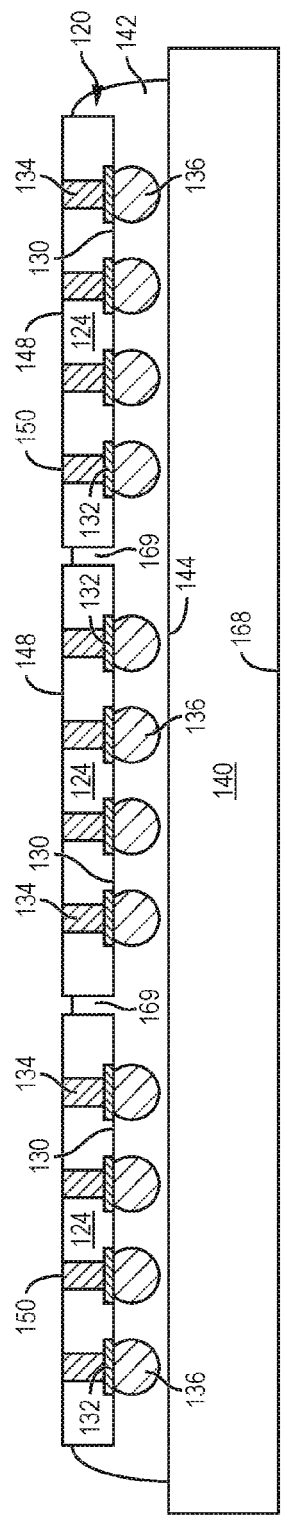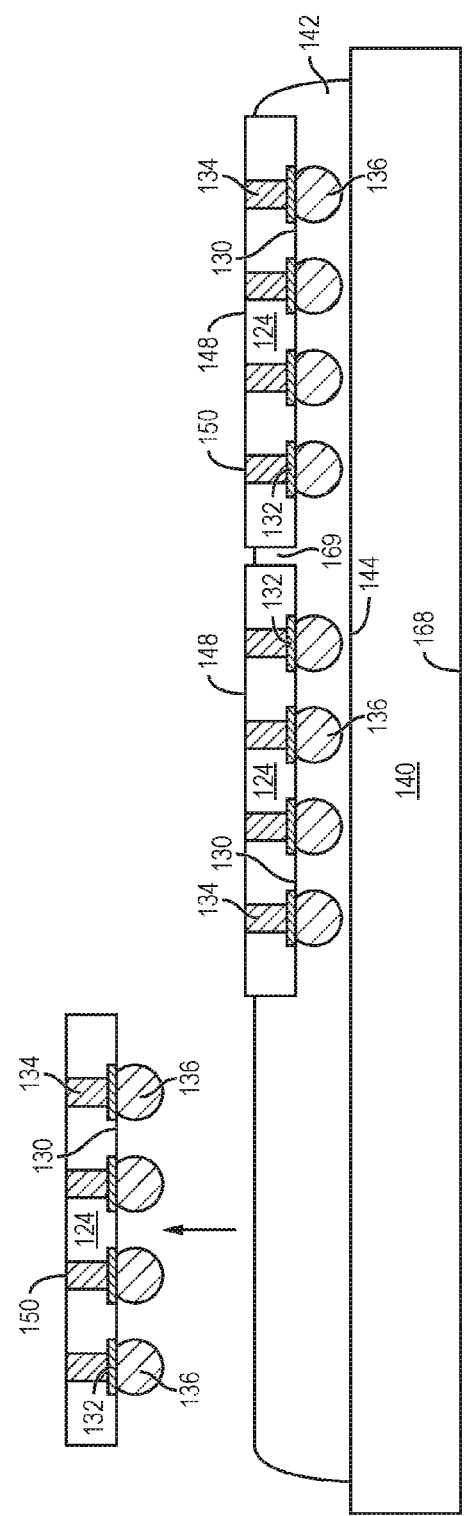

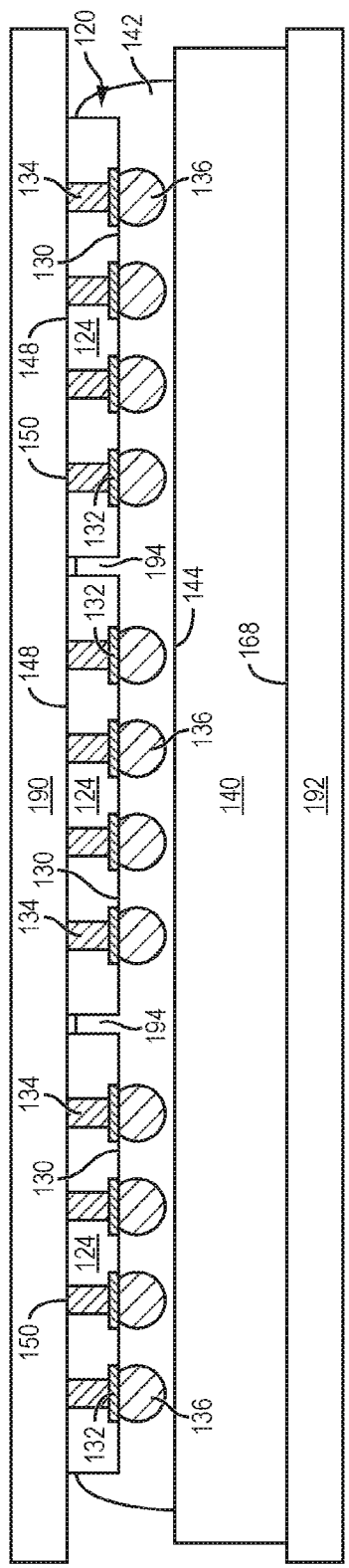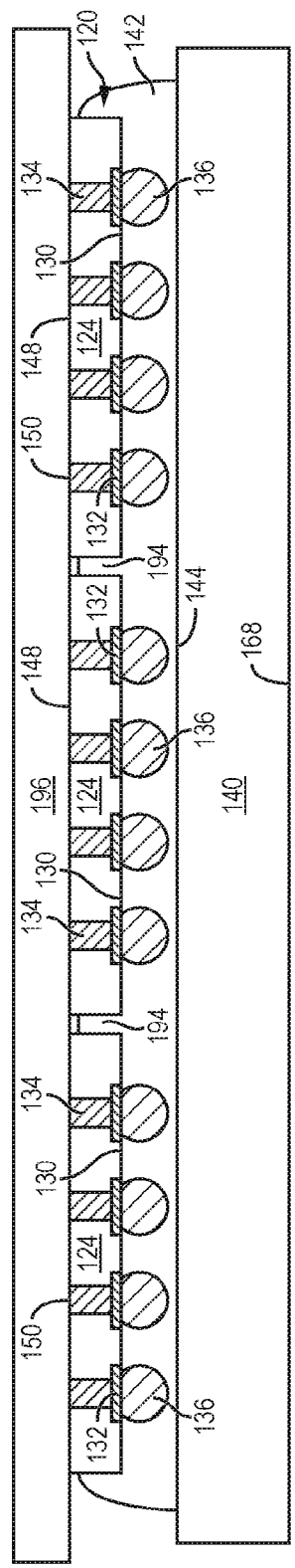
FIG. 4a
FIG. 4b

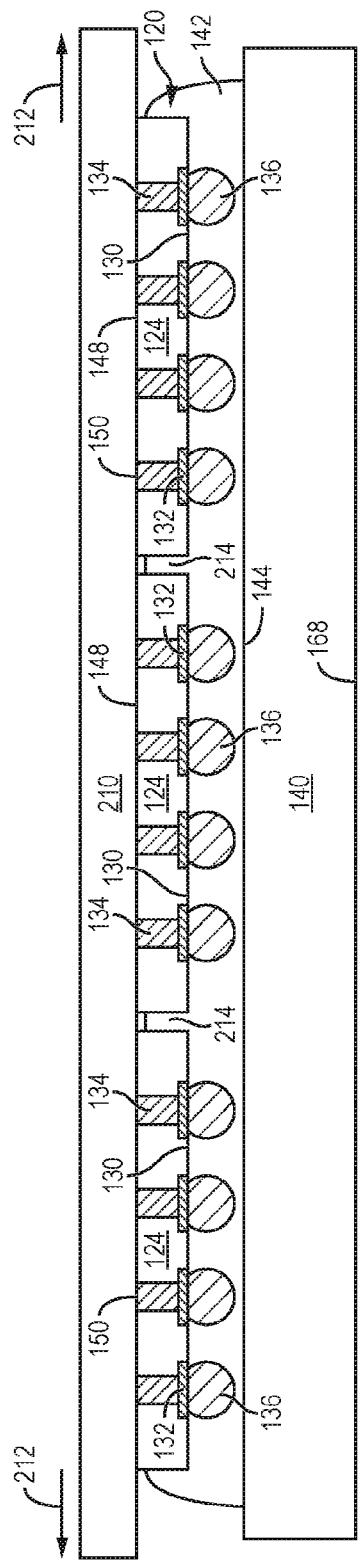

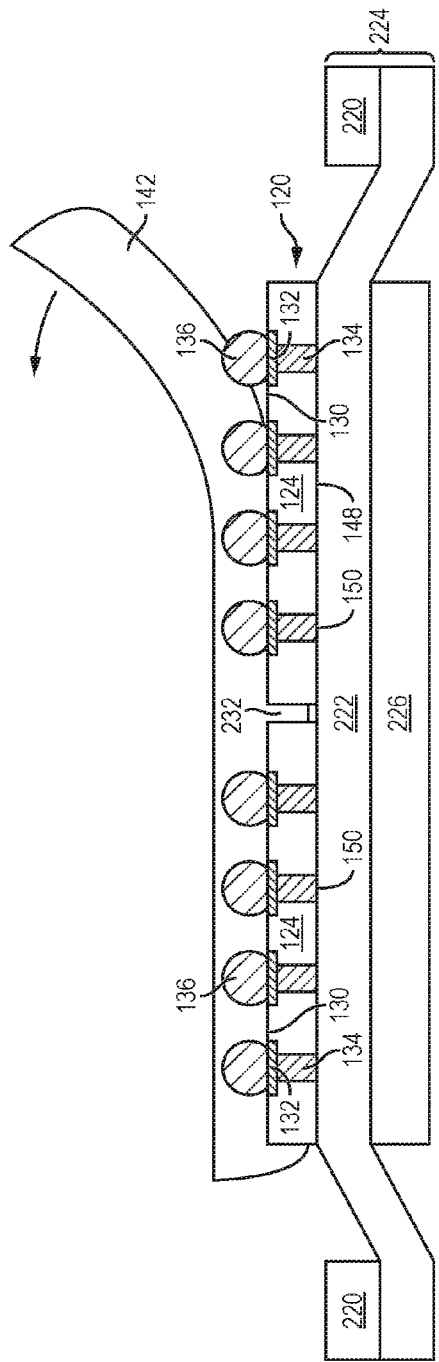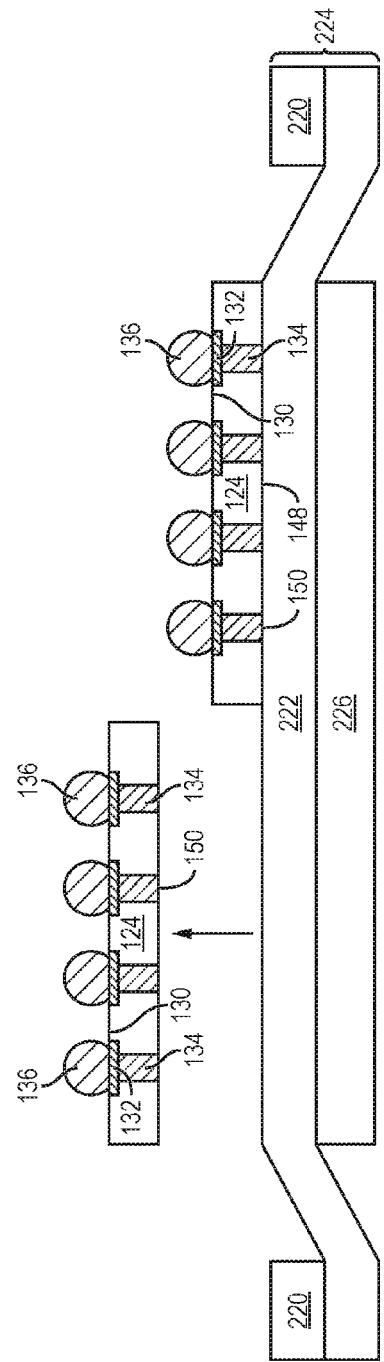
FIG. 6f
FIG. 6g

SEMICONDUCTOR DEVICE AND METHOD OF SINGULATING THIN SEMICONDUCTOR WAFER ON CARRIER ALONG MODIFIED REGION WITHIN NON-ACTIVE REGION FORMED BY IRRADIATING ENERGY

CLAIM OF DOMESTIC PRIORITY

The present application is a continuation of U.S. patent application Ser. No. 13/469,754, now U.S. Pat. No. 9,559,004, filed May 11, 2012, which claims the benefit of Provisional Application No. 61/485,545, filed May 12, 2011, which applications are incorporated herein by reference.

FIELD OF THE INVENTION

The present invention relates in general to semiconductor devices and, more particularly, to a semiconductor device and method of singulating a thin semiconductor wafer on a carrier along a modified region within a non-active region formed by irradiating energy.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Developments in semiconductor packaging include the use of three dimensional (3D) packaging, which includes the integration of multiple semiconductor die within a single package. In order to accommodate smaller package sizes and greater package integration, a thickness of semiconductor wafers has been reduced to enable thinner integrated packages. However, as package sizes shrink and semiconductor wafers become thinner, semiconductor wafers become more susceptible to damage and are at a greater risk of losing device functionality during back-end manufacturing and during assembly processes. In the assembly process, handling of thin wafers after the wafers are debonded from a carrier presents a significant risk as the thin wafers and bumps are processed without protection from the debonded carrier. Mechanical dicing is one such process that can damage the bumps formed on a thin wafer and can further cause a material of thin wafer, such as silicon (Si), to crack and degrade device performance. Stealth dicing is sometimes used instead of mechanical dicing to reduce Si chipping, reduce the number of particles produced during singulation, and to reduce kerf width, thereby reducing a risk of damaging metal layers and bumps formed over the semiconductor die. However, stealth dicing can still leave thin wafers and bumps exposed and without protection, thereby providing an opportunity for the thin wafers and bumps to be damaged.

SUMMARY OF THE INVENTION

A need exists for more efficient singulation of a semiconductor wafer while protecting the semiconductor wafer and bumps. Accordingly, in one embodiment, the present invention is a method of making a semiconductor device comprising the steps of providing a carrier including an adhesive disposed over the carrier, providing a semiconductor wafer including a plurality of semiconductor die separated by a non-active region, forming a plurality of bumps over the semiconductor die, and mounting the semiconductor wafer to the carrier with the adhesive disposed around the plurality of bumps. The method further includes the steps of applying irradiated energy to the non-active region to form a modified region within the non-active region, singulating the semiconductor wafer along the modified region to separate the semiconductor die, and removing the adhesive from around the plurality of bumps after singulating the semiconductor wafer.

In another embodiment, the present invention is a method of making a semiconductor device comprising the steps of providing a carrier including an adhesive disposed over the carrier, mounting a semiconductor wafer over the carrier with bumps of the semiconductor wafer embedded in the adhesive, applying irradiated energy to a non-active region of the semiconductor wafer to form a modified region, and singulating the semiconductor wafer along the modified region.

In another embodiment, the present invention is a method of making a semiconductor device comprising the steps of providing a semiconductor wafer, applying irradiated energy to the semiconductor wafer to form a modified region, and singulating the semiconductor wafer along the modified region.

In another embodiment, the present invention is a semiconductor device comprising a semiconductor wafer including bumps. An adhesive is disposed around the bumps. A modified region is formed within a non-active region of the semiconductor wafer by irradiated energy. The modified region of the semiconductor wafer includes polysilicon.

BRIEF DESCRIPTION OF THE DRAWINGS

FIGS. 4a-4d illustrate another process of singulating a semiconductor wafer by stealth dicing;

FIGS. 5a-5c illustrate a process of singulating a semiconductor wafer by stealth dicing; and FIGS. 6a-6g illustrate another process of singulating a semiconductor wafer by stealth dicing.

DETAILED DESCRIPTION OF THE DRAWINGS

Figure 1:
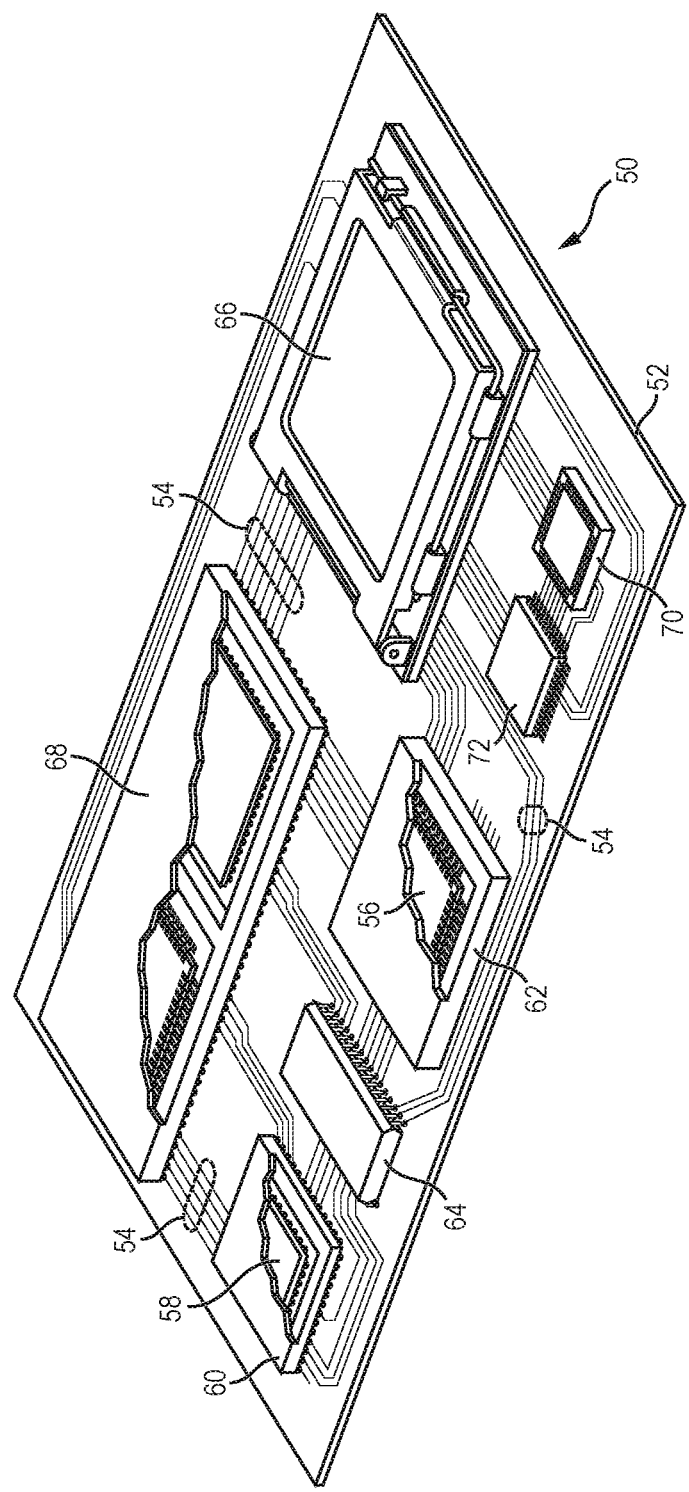
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 including a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
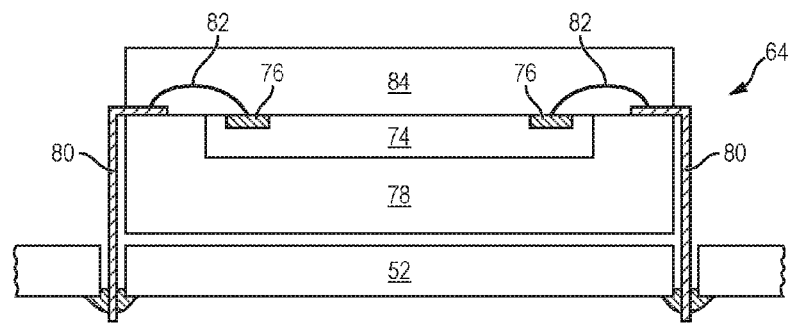
FIGS. 2a-2c illustrate further detail of the representative semiconductor packages mounted to the PCB.
Figure 2B:
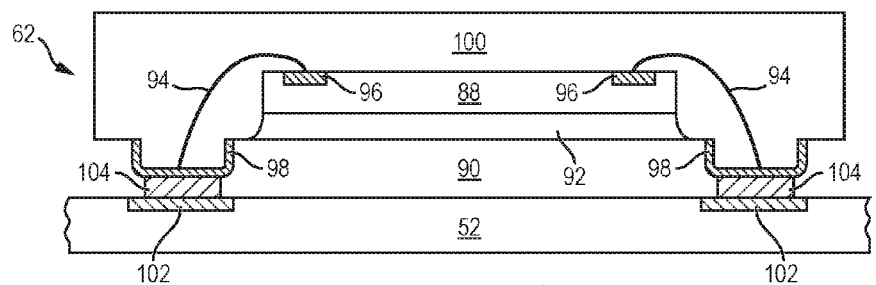
Figure 2C:
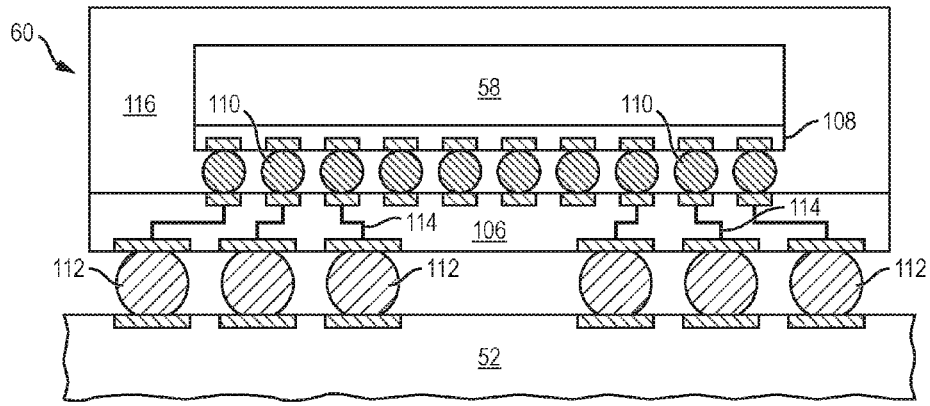

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
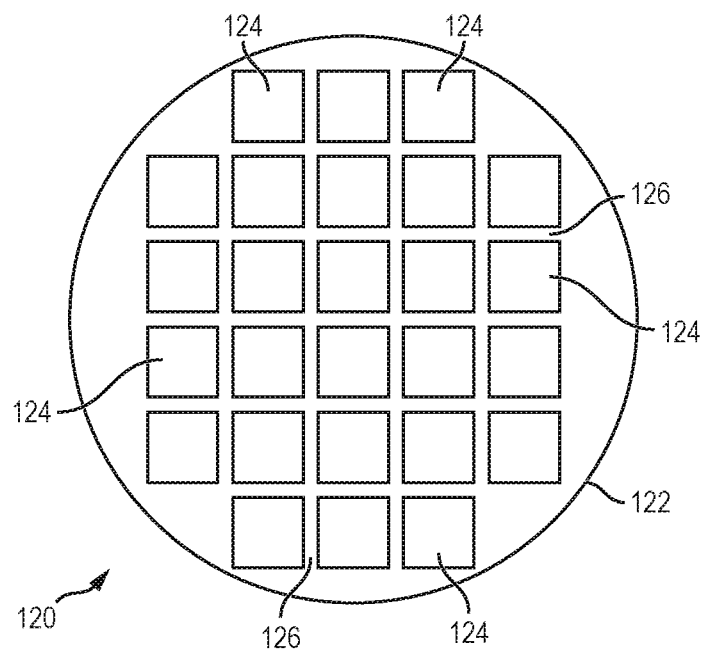
FIGS. 3a-3r illustrate a process of singulating a semiconductor wafer by stealth dicing.
Figure 3B:
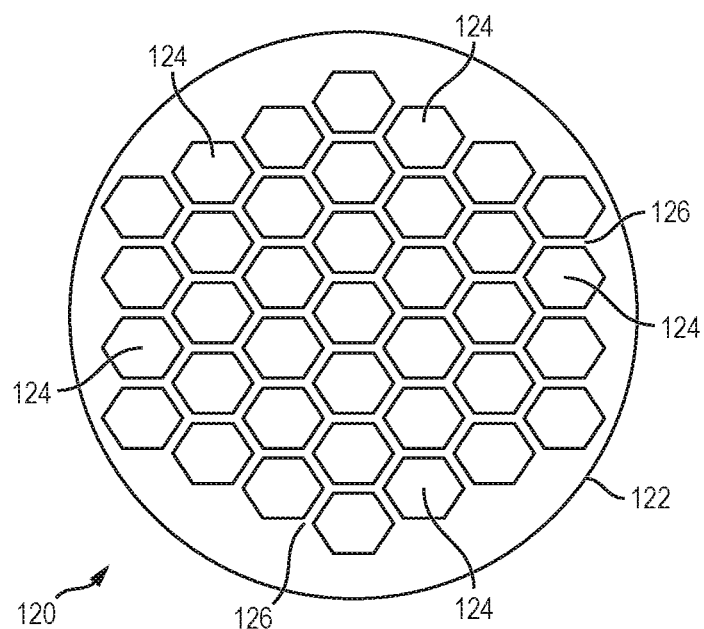

FIGS. 3a-3r illustrate, in relation to FIGS. 1 and 2a-2c, a process of singulating a semiconductor wafer by stealth dicing while an adhesive is disposed around conductive bumps formed on the semiconductor wafer. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on semiconductor wafer 120 separated by a non-active, inter-die wafer area or region 126 as described above. Non-active region 126 provides an area to singulate semiconductor wafer 120 into individual semiconductor die 124. Semiconductor die 124 can also be shaped as triangles, rectangles, parallelograms, hexagons, or general polygons with 3 or more sides. For example, FIG. 3b shows semiconductor wafer 120 with a plurality of hexagonal semiconductor die 124 separated by non-active region 126. FIG. 3c shows semiconductor wafer 120 with a plurality of triangular semiconductor die 124 separated by non-active region 126.

FIG. 3d shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3d. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Figure 3E:
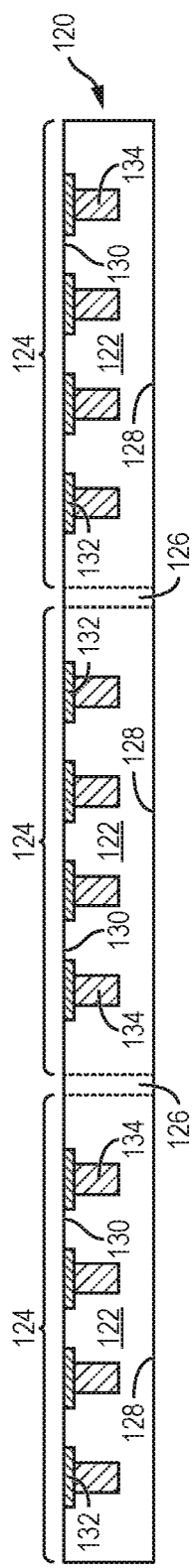
Figure 3F:
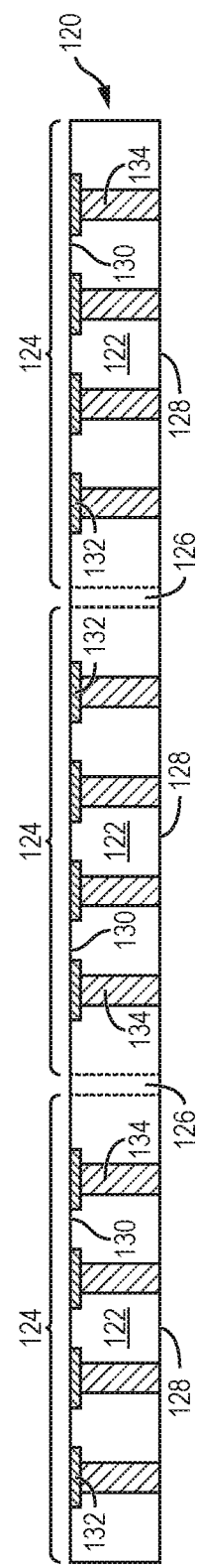

FIG. 3e shows a cross-sectional view of a portion of semiconductor wafer 120 similar to FIG. 3d. A plurality of vias is formed into active surface 130 and extends partially through semiconductor wafer 120 using mechanical drilling, laser drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction conductive TSV 134 embedded within semiconductor die 124. In one embodiment, conductive TSVs 134 are blind conductive TSVs and extend partially, but not completely, between back surface 128 and active surface 130. Alternatively, conductive TSVs 134 extend completely through semiconductor die 124 from back surface 128 to active surface 130 as shown in FIG. 3f. Thus, the process shown in FIGS. 3a-3r includes various TSV and non-TSV semiconductor wafers 120.

Figure 3G:
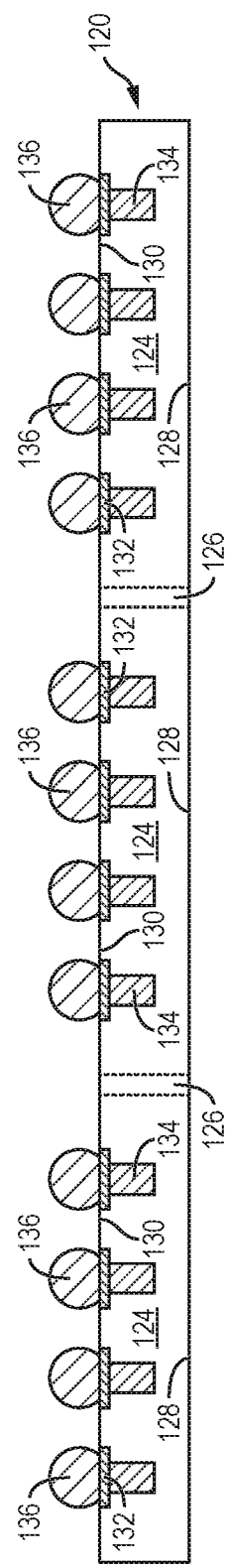

FIG. 3g, continuing from FIG. 3d, 3e, or 3f, shows an electrically conductive bump material is formed over conductive layer 132 using an evaporation, electrolytic plating, electroless plating, ball drop, or screen printing process. The bump material can be Al, Sn, Ni, Au, Ag, Pb, bismuth (Bi), Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above its melting point to form balls or bumps 136. In some applications, bumps 136 are reflowed a second time to improve electrical contact to conductive layer 132.

Bumps 136 can also be compression bonded or thermocompression bonded to conductive layer 132. Compression bonding uses pressure in excess of 10 megapascals (MPa) (1450 psi) at temperatures below 200° C. to bond materials via solid-state diffusion. Typical materials bonded using compression bonding include indium (In), Au, Pb, and Pb/Sn alloys. Thermocompression bonding uses elevated temperatures in conjunction with pressure to bond materials. Typical materials bonded using thermocompression bonding include Cu, Au, and Al. In one embodiment, thermocompression bonding is used to bond Au bumps by applying 30 MPa of pressure at 300° C. for 2 minutes. Bumps 136 represent one type of interconnect structure that can be formed over conductive layer 132. The interconnect structure can also use stud bump, micro bump, conductive column, or other electrical interconnect.

FIG. 3h shows carrier or temporary substrate 140 containing base material such as metal, silicon, polymer, polymer composite, ceramic, glass, glass epoxy, beryllium oxide, or other suitable low-cost, rigid material or bulk semiconductor material for structural support. A temporary adhesive or bonding film 142 is formed over a surface 144 of carrier 140. Adhesive 142 is an ultraviolet (UV) releasable adhesive, a thermo-releasable adhesive or film layer, an evaporable adhesive or glue coating, or other suitable material. Semiconductor wafer 120 is mounted to carrier 140 and adhesive 142 with active surface 130 oriented toward the carrier.

Figure 3J:
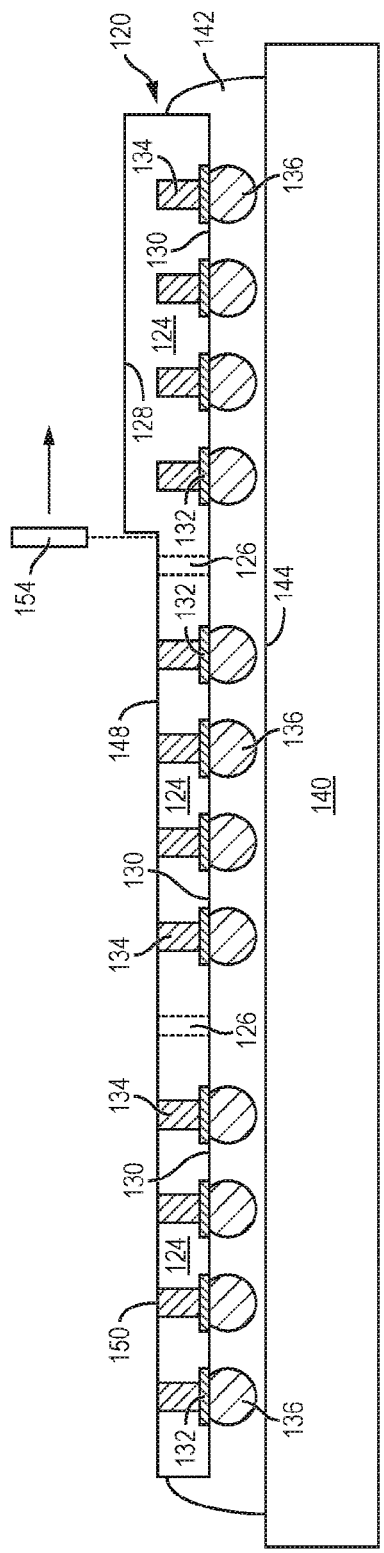

In FIG. 3i, semiconductor wafer 120 with bumps 136 is mounted to carrier 140 so that adhesive 142 is disposed over and protects active surface 130. Adhesive 142 is also disposed around bumps 136 to cover and protect the bumps. Bumps 136 are completely covered by adhesive 142, or alternatively, bumps 136 extend through the adhesive and contact surface 144 of carrier 140 such that a portion of bumps 136 is exposed upon the subsequent removal of carrier 140. Carrier 140 provides structural support for subsequent process steps and handling such as backgrinding to reduce a risk of damaging semiconductor wafer 120 and bumps 136. A portion of semiconductor wafer 120 including back surface 128 is optionally removed by a combination of backgrinding with grinder 146, CMP, and/or etching processes to form a back surface 148 of the semiconductor wafer including a reduced thickness. When conductive TSVs 134 are present within semiconductor wafer 120, the removal of the portion of the semiconductor wafer to expose back surface 148 also exposes back surfaces 150 of the conductive TSVs, which facilitate subsequent vertical electrical interconnect between opposing surfaces of the semiconductor die 124. Back surface 148 of semiconductor wafer 120 is substantially coplanar with back surfaces 150 of conductive TSVs 134. Alternatively, a portion of back surface 128 is removed by laser direct ablation (LDA) using laser 154 to form back surface 148 of semiconductor wafer 120, as shown in FIG. 3j. The reduced thickness of semiconductor wafer 120 provides semiconductor die with a reduced vertical profile compatible with smaller more compact semiconductor devices including semiconductor packages with reduced package height.

Figure 3K:
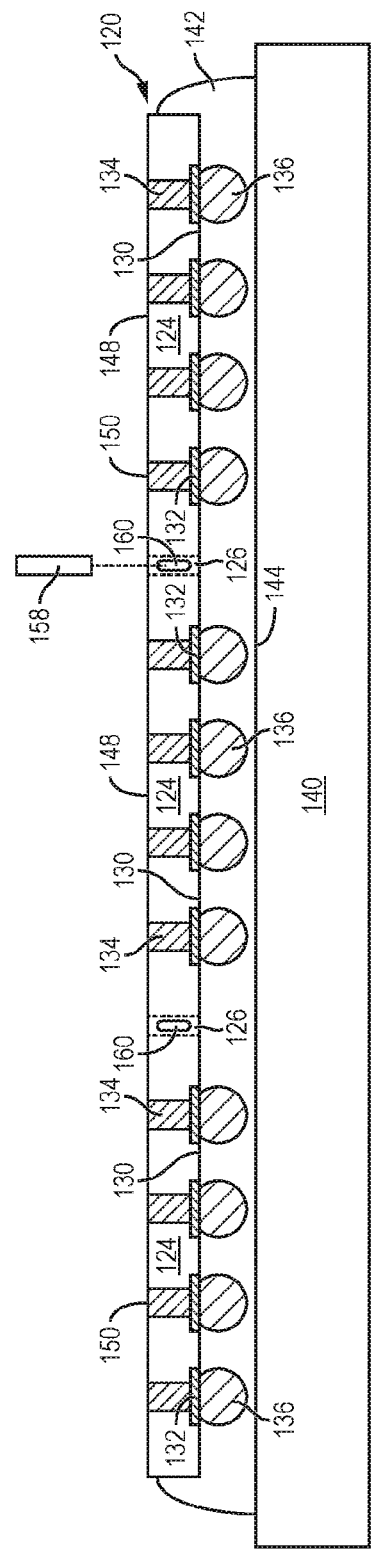

In FIG. 3k, laser 158 emits irradiated energy which passes into non-active region 126 of semiconductor wafer 120 to form modified region 160. In one embodiment, the light energy emitted by laser 158 has a wavelength of 1064 nanometers and produces light pulses of 1 microsecond or less duration, repeated at 10 microsecond intervals, with a peak power intensity of 100 megawatts/cm2. Absorption of the laser light energy at the focal point of laser 158 modifies the material characteristics of base substrate material 122 in modified region 160. For example, if base substrate material 122 is primarily silicon, then the absorption of the laser light energy causes the silicon material to melt and re-solidify as polysilicon. The material within modified region 160 can also be vaporized, displaced, or changed in structure or composition by laser 158 to create a gap, crack, or void in modified region 160. The modified region 160 can be contained within the interior of the unmodified non-active region 126, i.e., a portion of the unmodified non-active region remains around modified region 160. Alternatively, modified region 160 extends between an upper surface and lower surface of semiconductor wafer 120 with the unmodified non-active region 126 remaining on each side of, or laterally offset from, modified region 160. Modified region 160 can occupy the entire area of non-active region 126, and can be formed as a continuous body or as a number of discrete bodies. Modified region 160 can be vertical, diagonal, circular, oval, curved, or other shape. In other embodiments, modified region 160 can be formed using visible light, ultraviolet light, x-rays, microwaves, acoustic energy, ion beams, high energy particles, or other forms of radiated energy.

The modified region 160 is weaker than the unmodified material in non-active region 126 around modified region 160 and readily subject to breaking, fracture, or separation under temperature change, acoustic energy, chemical reaction, or mechanical pressure or stress including tensile stress, mechanical pressure, or bending moment. The weaker modified region 160 creates a separation point for the singulation of semiconductor wafer 120 into individual semiconductor die 124 along modified region 160 within non-active region 126 when subjected to temperature change, thermal cycling, or other stimulus.

Figure 3L:
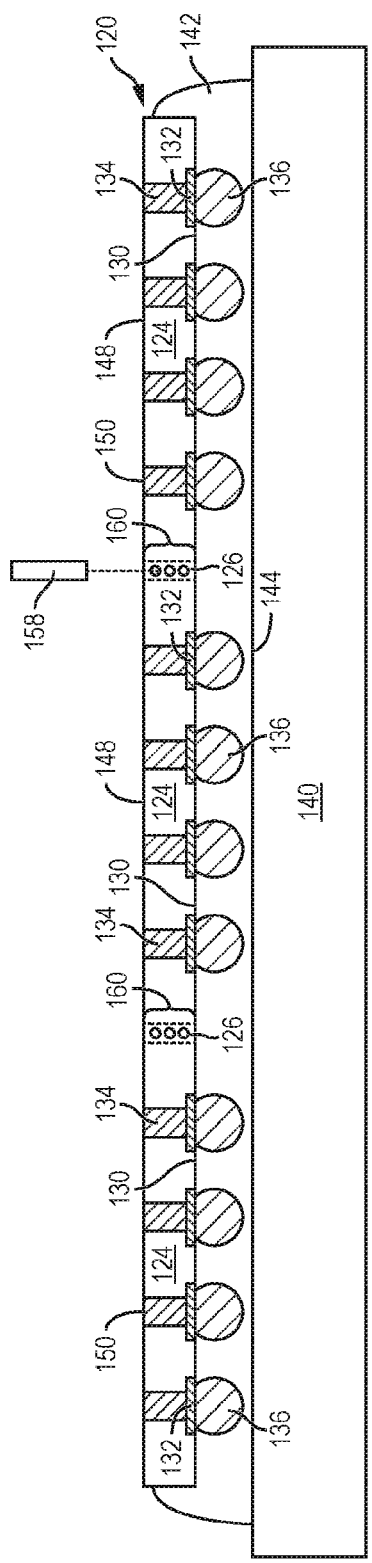

FIG. 3l shows an embodiment with multiple modified regions 160 vertically aligned or stacked within non-active region 126, i.e., each modified region 160 is vertically aligned with, and offset from, other modified regions. Laser 158 passes over non-active region 126 a single time or multiple times to form multiple modified regions 160 at vertically offset locations within the non-active region. The focal point of laser 158 can be altered by vertically displacing the laser, altering the configuration of the optical path that the laser energy passes through, altering the optical properties of an element of the optical path that the laser energy passes through, or altering the wavelength of the laser.

Figure 3M:
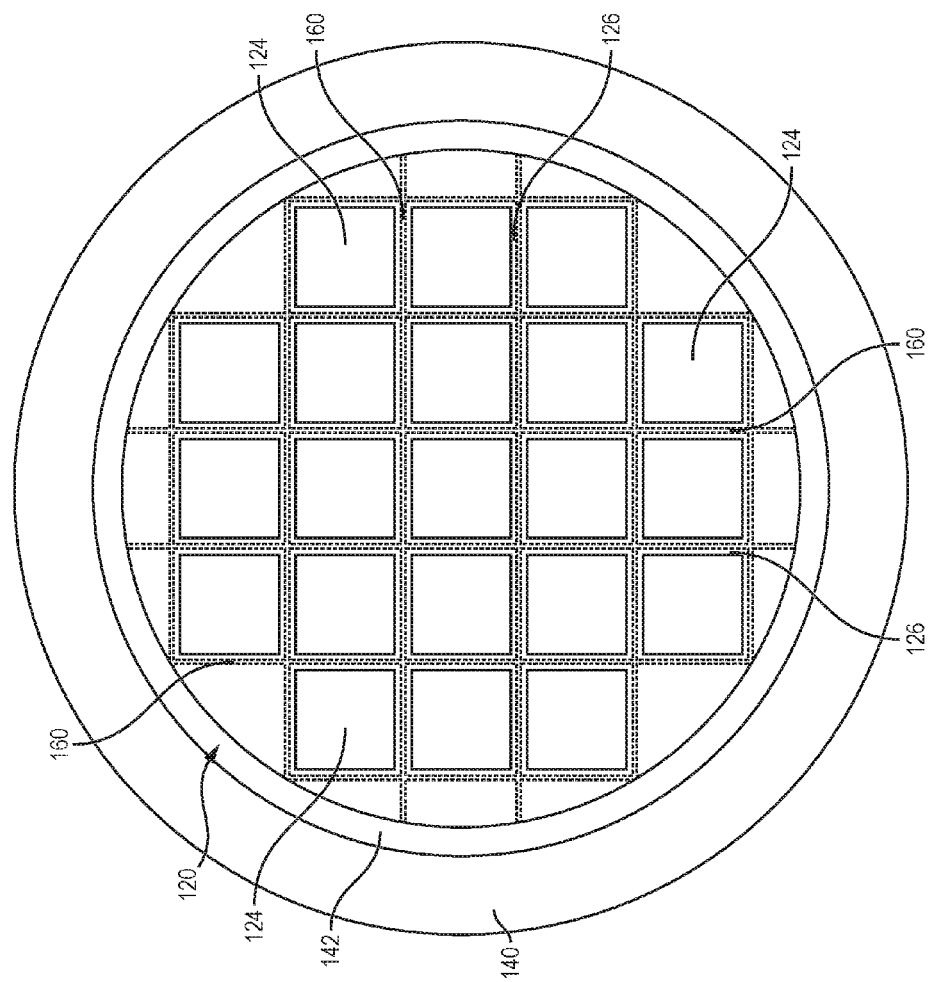
Figure 3N:
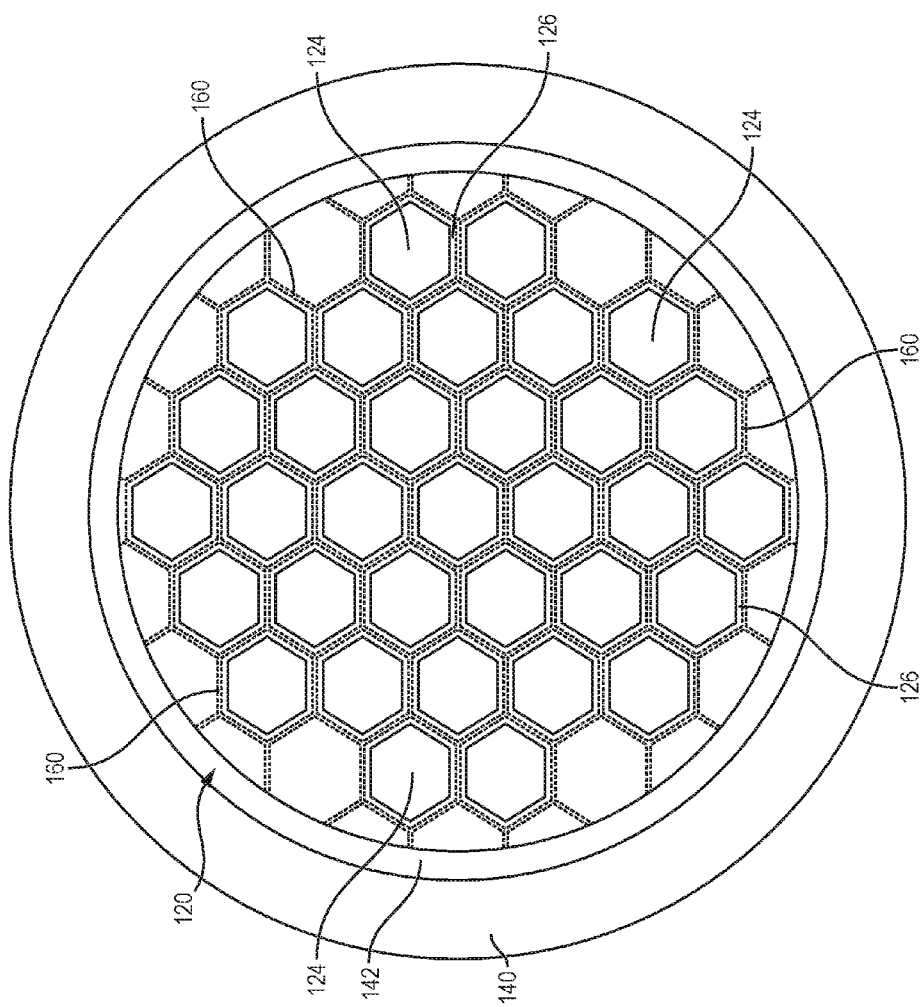

FIG. 3m shows a plan view of semiconductor wafer 120 containing modified region 160 within non-active region 126 around semiconductor die 124. The modified region 160 is formed by moving laser 158 over non-active region 126 or moving the non-active region under the laser while the laser is operating. FIG. 3n shows a plan view of an embodiment of semiconductor wafer 120 containing hexagonal semiconductor die 124 and modified region 160 formed within non-active region 126.

In FIG. 3o, a cooling element or device 164 contacts back surface 148 of semiconductor wafer 120 while a heating element or device 166 contacts surface 168 of carrier 140 opposite surface 144. Cooling element 164 has a temperature less than a temperature of semiconductor wafer 120 that draws heat from back surface 148 of the semiconductor wafer, thereby reducing a temperature of the back surface and further causing thermally induced contraction of material 122 at the back surface of the semiconductor wafer adjacent to the cooling element. Conversely, heating element 166 has a temperature greater than a temperature of semiconductor wafer 120 and carrier 140 that transfers heat from the heating element to carrier 140 and to active surface 130 of semiconductor die 124, thereby increasing a temperature of the active surface and further causing thermally induced expansion of material 122 at the active surface of the semiconductor wafer. The temperature differential between back surface 148 and active surface 130 of semiconductor wafer 120 causes a temperature gradient across the semiconductor die that produces stress within semiconductor wafer and causes modified region 160 to break, fracture, separate, or otherwise lose structural integrity. Alternatively, the temperature differential across semiconductor wafer 120 is achieved by using only cooling element 164 or by using only heating element 166 instead of using both the cooling and heating elements.

Because modified region 160 has been previously weakened, as described above, the thermally induced stress causes cracking along the modified region to singulate semiconductor wafer 120 into individual semiconductor die 124. The weakened state of modified region 160 confines the cracking of the semiconductor wafer to the modified region within non-active region 126 and prevents cracking from occurring within semiconductor die 124 and damaging components within active surface 130. The singulation of semiconductor wafer 120 along modified region 160 forms gap 169 between semiconductor die 124. Singulation of semiconductor die 124 occurs while adhesive 142 is still disposed over active surface 130 and around bumps 136. A pliability or malleability of adhesive 142 allows for separation between semiconductor die 124 and formation of gap 169 without damaging bumps 136. Because semiconductor wafer 120 is singulated into individual semiconductor die 124 before removal of adhesive 142 and before separation of semiconductor die 124 from carrier 140, bumps 136 are protected by the adhesive and a risk of damaging the bumps is reduced. Additionally, a risk of damaging or breaking semiconductor wafer 120 due to mishandling after the wafer has been thinned by backgrinding is reduced because semiconductor wafer 120 remains attached to carrier 140 until after singulation of the semiconductor die.

FIG. 3p shows heating element or device 167 and cooling element or device 170 are mounted over opposing sides of semiconductor wafer 120, similar to cooling and heating elements 164 and 166, respectively, shown in FIG. 3o. FIG. 3p differs from FIG. 3o in that heating element 167, rather than cooling element 164, contacts back surface 148 of semiconductor wafer 120 while cooling element 170, rather than heating element 166, contacts surface 168 of carrier 140 opposite surface 144. Heating element 167 has a temperature greater than a temperature of semiconductor wafer 120 that transfers heat to back surface 148 of the semiconductor wafer, thereby increasing a temperature of the back surface and further causing thermally induced expansion of material 122 at the back surface of the semiconductor wafer adjacent to the heating element. Conversely, cooling element 170 has a temperature less than a temperature of semiconductor wafer 120 and carrier 140 that draws heat from carrier 140 and from active surface 130 of semiconductor die 124, thereby decreasing a temperature of the active surface and further causing thermally induced contraction of material 122 at the active surface of the semiconductor wafer. The temperature differential between back surface 148 and active surface 130 of semiconductor wafer 120 causes a temperature gradient across the semiconductor die that produces stress within the semiconductor wafer and causes modified region 160 to break, fracture, separate, or otherwise lose structural integrity. The loss of structural integrity in modified region 160 is produced by the temperature differential created by heating element 167 and cooling element 170 as shown in FIG. 3p. Alternatively, the temperature differential across semiconductor wafer 120 is achieved by using only cooling element 170 or by using only heating element 167 instead of using both the cooling and heating elements.

In another embodiment, the loss of structural integrity in modified region 160 is produced by a two-step process. First, a temperature differential is generated as described in FIG. 3o. Second, the temperature differential described above for FIG. 3p is subsequently produced such that the temperature differential of FIG. 3o followed by the temperature differential of FIG. 3p causes the loss of structural integrity in modified region 160. Conversely, the temperature differential created by the process of FIG. 3p can be followed by the temperature differential created by the process of FIG. 3o to cause the loss of structural integrity, thereby forming gap 169 between semiconductor die 124.

Because modified region 160 has been previously weakened, as described above, the thermally induced stress causes cracking along the modified region to singulate the semiconductor wafer into individual semiconductor die 124. The weakened state of modified region 160 confines the cracking of the semiconductor wafer to the modified region within non-active region 126 and prevents cracking from occurring within semiconductor die 124 and damaging components within active surface 130. The singulation of semiconductor wafer 120 along modified region 160 forms gap 169 between semiconductor die 124. Singulation of semiconductor die 124 occurs while adhesive 142 is still disposed over active surface 130 and around bumps 136. A pliability or malleability of adhesive 142 allows for separation between semiconductor die 124 and formation of gap 169 without damaging bumps 136. Because semiconductor wafer 120 is singulated into individual semiconductor die 124 before removal of adhesive 142 and separation of semiconductor die 124 from carrier 140, bumps 136 are protected by the adhesive to reduce a risk of damaging the bumps. Additionally, a risk of damaging or breaking semiconductor wafer 120 due to mishandling after the wafer has been thinned by backgrinding is reduced because semiconductor wafer 120 remains attached to carrier 140 until after singulation of the semiconductor die.

FIG. 3q shows semiconductor wafer 120 singulated into individual semiconductor die 124 after being subjected to the thermally induced cracking described above. Semiconductor die 124 are mounted to carrier 140 with adhesive 142 such that bumps 136 are protected by the adhesive during the singulation process. Because semiconductor die 124 remain attached to carrier 140 with adhesive 142 until the semiconductor die are removed for subsequent handling, a risk of damaging the semiconductor die due to mishandling is reduced.

In FIG. 3r, singulated semiconductor die 124 are removed from carrier 140 and adhesive 142 in a pick and place operation for subsequent bonding or integration of the semiconductor die within additional packaging. Removal of semiconductor die 124 from adhesive 142 is optionally assisted by heating or warming of adhesive 142. Adhesive 142 is heated, for example, by applying a heat source under surface 168 of carrier 140, which warms the carrier and adhesive before removal of semiconductor die 124 from adhesive 142, and removal of the adhesive from around bumps 136. Warming adhesive 142 softens the adhesive to weaken the bond between the adhesive and the carrier, thereby easing the removal of semiconductor die 124 from the adhesive.

As described above, a modified region 160 is formed in non-active region 126 of semiconductor wafer 120 by using laser 158 to irradiate energy and modify the base substrate material to create a weak separation region for stealth dicing of the semiconductor wafer. The laser singulation process increases the number of semiconductor die 124 per semiconductor wafer 120 by reducing the width of non-active region 126 and/or by using a more space efficient arrangement of the semiconductor die. The stealth dicing process allows for narrower non-active region 126 for less wasted wafer area and more semiconductor die 124 per semiconductor wafer 120. The laser singulation process reduces the number of defects that are introduced into the semiconductor wafer during manufacturing by reducing contaminated material or debris produced during singulation, thereby reducing a need for post-singulation wafer cleaning.

The formation of weaker modified region 160 as part of the laser singulation process creates a separation point for the singulation of semiconductor wafer 120 when subjected to temperature change, thermal cycling, or other stimulus. Singulation of semiconductor die 124 occurs while adhesive 142 is still disposed over active surface 130 and around bumps 136. Because semiconductor wafer 120 is singulated into individual semiconductor die 124 before removal of adhesive 142 and separation of semiconductor die 124 from carrier 140, bumps 136 are protected by the adhesive to reduce a risk of damaging the bumps. Additionally, a risk of damaging or breaking semiconductor wafer 120 due to mishandling after the wafer has been thinned by backgrinding is reduced because semiconductor wafer 120 remains attached to carrier 140 until after singulation of the semiconductor die. Furthermore, singulation of semiconductor die 124 before removal of adhesive 142 provides a cost effective process for reducing a risk of damaging or breaking semiconductor wafer 120, semiconductor die 124, active surface 130, and bumps 136 while providing increased functionality for handling thinned wafers during a back-end assembly processes.

In addition, the stealth dicing process allows for a wide variety of shapes for semiconductor die 124, resulting in a more space efficient layout of the semiconductor die on semiconductor wafer 120. Some shapes of semiconductor die 124 made possible by the stealth dicing process, such as a triangle, rectangle, parallelogram, hexagon, or general polygon with 3 or more sides, enable the production of larger-area semiconductor die by reducing the effect of focus and depth of focus limitations, off-axis illumination, and vignetting at the corners of the semiconductor die during manufacturing photolithography steps.

The laser singulation process is applicable to larger semiconductor die. The larger semiconductor die can integrate more functionality onto the die to reduce cost, improve performance, and reduce power consumption, as compared to a multi-die implementation that provides the same functionality. The larger semiconductor die can be produced by reducing the effect of optical imperfections that occur at the periphery of the exposure area during the photolithographic processing commonly employed to manufacture semiconductor wafers. Typical optical imperfections that occur at the periphery of the exposure area during photolithographic processing include lack of focus, insufficient depth of focus, off-angle illumination, and reduced illumination intensity relative to the illumination intensity at the center of the exposed area.

FIG. 4a, continuing from FIG. 3m or 3n, is similar to FIG. 3o or 3p and shows a cooling element or device 190 contacts back surface 148 of semiconductor wafer 120 while a heating element or device 192 contacts surface 168 of carrier 140 opposite surface 144. Cooling element 190 has a temperature less than a temperature of semiconductor wafer 120 that draws heat from back surface 148 of the semiconductor wafer to reduce a temperature of the back surface and further causes thermally induced contraction of material 122 at the back surface of the semiconductor wafer adjacent to the cooling element. Conversely, heating element 192 has a temperature greater than a temperature of semiconductor wafer 120 and carrier 140 that transfers heat from the heating element to carrier 140 and to active surface 130 of semiconductor die 124, thereby increasing a temperature of the active surface and causing thermally induced expansion of material 122 at the active surface of the semiconductor wafer. The temperature differential between back surface 148 and active surface 130 of semiconductor wafer 120 causes a temperature gradient across the semiconductor die that produces stress within semiconductor wafer and induces cracking. Alternatively, the temperature differential across semiconductor wafer 120 is achieved by disposing heating element 192 over back surface 148 of semiconductor wafer 120 while cooling element 190 contacts surface 168 of carrier 140 opposite surface 144. The temperature differential across semiconductor wafer 120 can also be achieved by using only cooling element 190 or by using only heating element 192 instead of using both the cooling and heating elements. The loss of structural integrity in modified region 160 can also be produced by a two-step process by disposing cooling element 190 and heating element 192 over opposing sides of the semiconductor wafer for a period of time, and then reversing the relative positions of the cooling and heating elements.

Because modified region 160 has been previously weakened, as described above, the thermally induced stress causes modified region 160 to break, fracture, separate, or otherwise lose structural integrity. The separation or loss of structural integrity in modified region 160 singulates semiconductor wafer 120 into separate semiconductor die 124 with gap 194 between the semiconductor die. A pliability or malleability of adhesive 142 allows for separation between semiconductor die 124 and formation of gap 194 without damaging bumps 136. The weakened state of modified region 160 confines the cracking of the semiconductor wafer to the modified region within non-active region 126 and prevents cracking from occurring within semiconductor die 124 and damaging components within active surface 130. The singulation of semiconductor wafer 120 along modified region 160 occurs while adhesive 142 is still disposed over active surface 130 and around bumps 136. Because semiconductor wafer 120 is singulated into individual semiconductor die 124 before removal of adhesive 142 and separation of semiconductor die 124 from carrier 140, bumps 136 are protected by the adhesive to reduce a risk of damaging the bumps. Additionally, a risk of damaging or breaking semiconductor wafer 120 due to mishandling after the wafer has been thinned by backgrinding is reduced because semiconductor wafer 120 remains attached to carrier 140 until after singulation of the semiconductor die.

FIG. 4b shows that after the removal of cooling element 190 and heating element 192, dicing or UV tape 196 is applied to back surface 148 of singulated semiconductor wafer 120 for structural support of the semiconductor wafer during subsequent manufacturing operations. Dicing tape 196 contains polyvinyl chloride, polypropylene, polyethylene, polyolefin, or similar materials. After dicing tape 196 is applied to back surface 148 of semiconductor wafer 120, carrier 140 is debonded or removed from adhesive 142 by chemical etching, mechanical peeling, CMP, mechanical grinding, thermal bake, UV light, laser scanning, or wet stripping to expose the adhesive. Alternatively, dicing tape 196 is applied before carrier 140 is debonded. During the singulation process and removal of carrier 140, bumps 136 of semiconductor die 124 are protected by adhesive 142. Because adhesive 142 covers bumps 136 and active surface 130 of semiconductor die 124 until the semiconductor die are removed from dicing tape 196 for subsequent handling, a risk of damaging the semiconductor die due to mishandling is reduced.

Figure 4C:
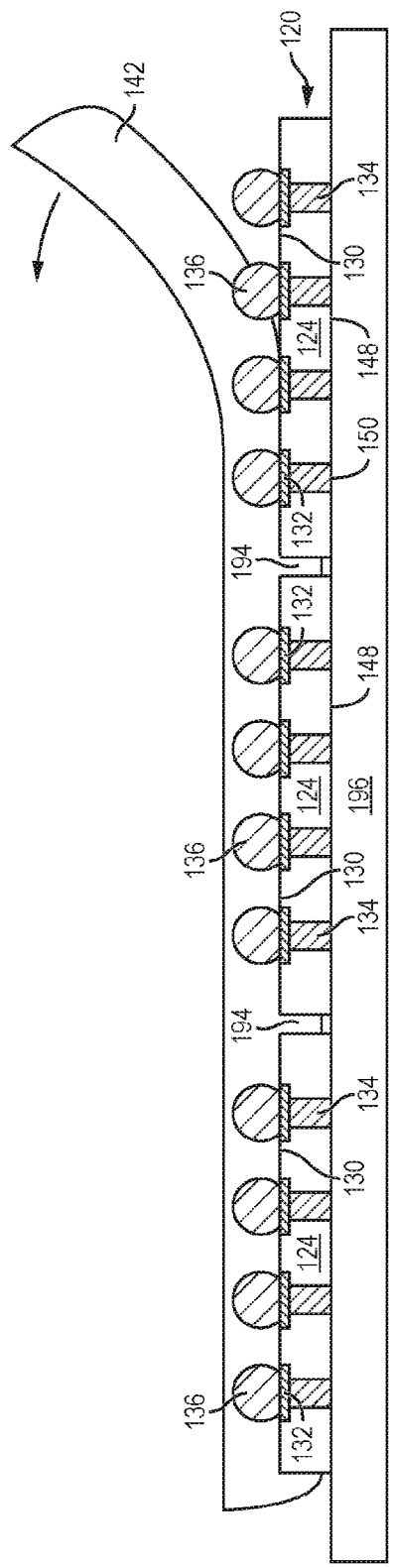

In FIG. 4c, adhesive 142 is peeled off or removed from singulated semiconductor wafer 120 and from around bumps 136 to expose the active surface of semiconductor die 124 and the bumps. Adhesive 142 is removed while back surface 148 of semiconductor wafer 120 or semiconductor die 124 is still attached to dicing tape 196.

Figure 4D:
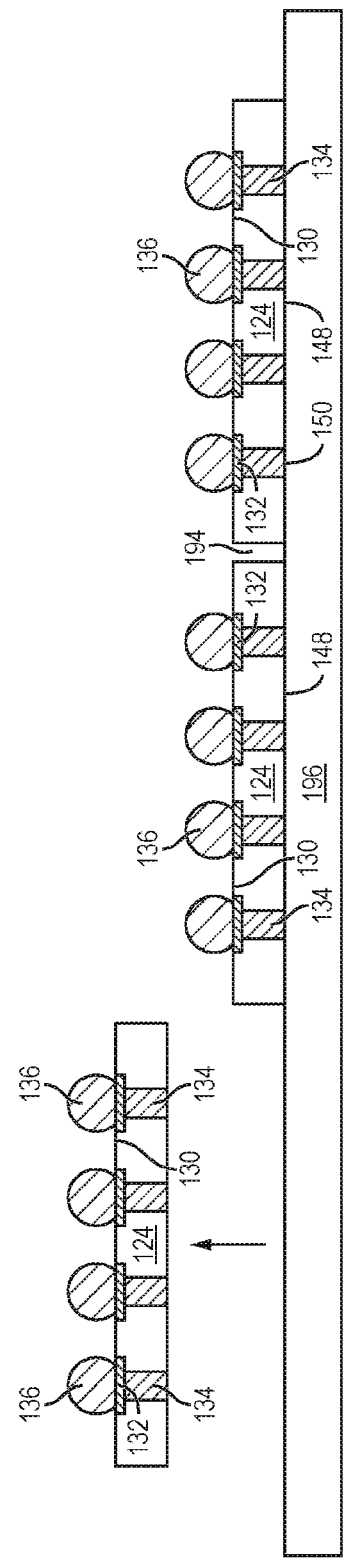

FIG. 4d shows back surface 148 of singulated semiconductor die 124 mounted to dicing tape 196. Semiconductor die 124 are removed from dicing tape 196 in a pick and place operation for subsequent bonding or integration of semiconductor die 124 within additional packaging. Because semiconductor wafer 120 is singulated into individual semiconductor die 124 before removal of adhesive 142 and separation of semiconductor die 124 from dicing tape 196, bumps 136 are protected by the adhesive to reduce a risk of damaging the bumps. Additionally, a risk of damaging or breaking semiconductor wafer 120 due to mishandling after the wafer has been thinned by backgrinding is reduced because semiconductor wafer 120 remains attached to dicing tape 196 until after singulation of the semiconductor die. Furthermore, singulation of semiconductor die 124 before removal of adhesive 142 provides a cost effective process for reducing a risk of damaging or breaking semiconductor wafer 120, semiconductor die 124, active surface 130, and bumps 136 while providing increased functionality for handling thinned wafers during a back-end assembly processes.

FIG. 5a, continuing from FIG. 3m or 3n, shows expandable tape 210 is applied to back surface 148 of semiconductor wafer 120 for structural support of the semiconductor wafer during subsequent manufacturing operations. Tape 210 contains polyvinyl chloride, polypropylene, polyethylene, polyolefin, or similar materials. After tape 210 is applied to back surface 148 of semiconductor wafer 120, a force is applied to the tape to stretch or expand the tape outwards from a center region of the semiconductor wafer, as shown by arrows 212. The stretching or expansion of tape 210 creates a shear force that produces stress in semiconductor wafer 120. The stress created in semiconductor wafer 120 by stretching or expanding tape 210 causes modified region 160 to break, fracture, separate, or otherwise lose structural integrity. The separation or loss of structural integrity in modified region 160 singulates semiconductor wafer 120 into separate semiconductor die 124 with gap 214 between the semiconductor die. Singulation of semiconductor wafer 120 by stretching or expanding tape 210 occurs while the semiconductor wafer is attached to carrier 140 with adhesive 142. Alternatively, singulation of semiconductor wafer 120 occurs by stretching or expanding tape 210 after the semiconductor wafer is removed from carrier 140. When semiconductor wafer 120 is singulated while attached to carrier 140, a pliability or malleability of adhesive 142 allows for separation between semiconductor die 124 and formation of gap 214 without damaging bumps 136.

Carrier 140 is debonded or removed from adhesive 142 by chemical etching, mechanical peeling, CMP, mechanical grinding, thermal bake, UV light, laser scanning, or wet stripping to expose the adhesive. During singulation and the removal of carrier 140, bumps 136 of semiconductor die 124 are protected by adhesive 142. Because adhesive 142 covers bumps 136 and active surface 130 of semiconductor die 124 until the semiconductor die are removed from tape 210 for subsequent handling, a risk of damaging the semiconductor die due to mishandling is reduced.

In FIG. 5b, adhesive 142 is peeled off or removed from singulated semiconductor wafer 120 and from around bumps 136 to expose active surface 130 of semiconductor die 124 and to expose the bumps. Tape 210 is mounted to a vacuum chuck for the removal of adhesive 142 and to provide structural support for the removal of adhesive 142 while back surface 148 of semiconductor die 120 is still attached to the tape.

Figure 5C:
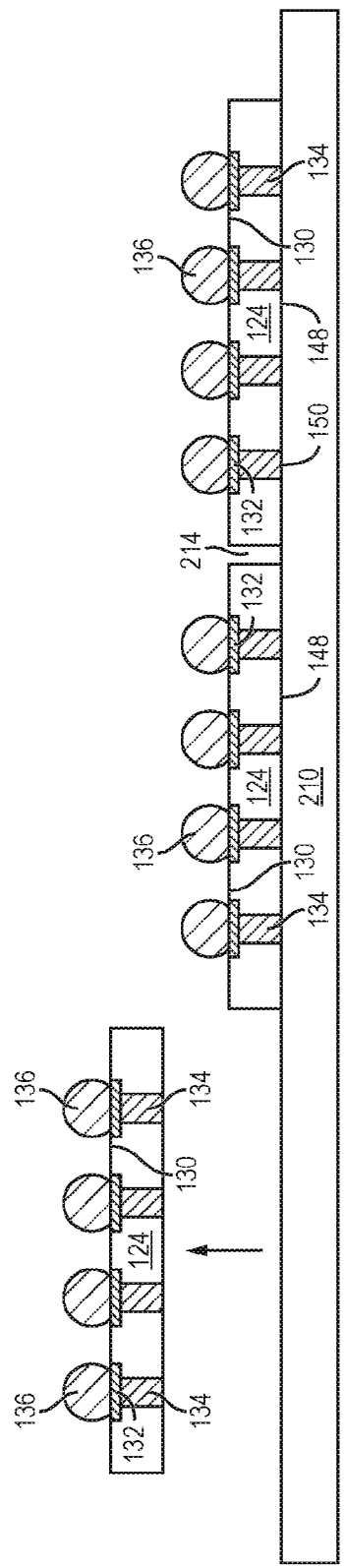

FIG. 5c shows back surface 148 of singulated semiconductor die 124 mounted to tape 210. Semiconductor die 124 are removed from tape 210 in a pick and place operation for subsequent bonding or integration of semiconductor die 124 within additional packaging. Because semiconductor wafer 120 is singulated into individual semiconductor die 124 before removal of adhesive 142 and separation of semiconductor die 124 from tape 210, bumps 136 are protected by the adhesive to reduce a risk of damaging the bumps. Additionally, a risk of damaging or breaking semiconductor wafer 120 due to mishandling after the wafer has been thinned by backgrinding is reduced because semiconductor wafer 120 remains attached to tape 210 until after singulation of the semiconductor die. Furthermore, singulation of semiconductor die 124 before removal of adhesive 142 provides a cost effective process for reducing a risk of damaging or breaking semiconductor wafer 120, semiconductor die 124, active surface 130, and bumps 136 while providing increased functionality for handling thinned wafers during a back-end assembly processes.

Figure 6A:
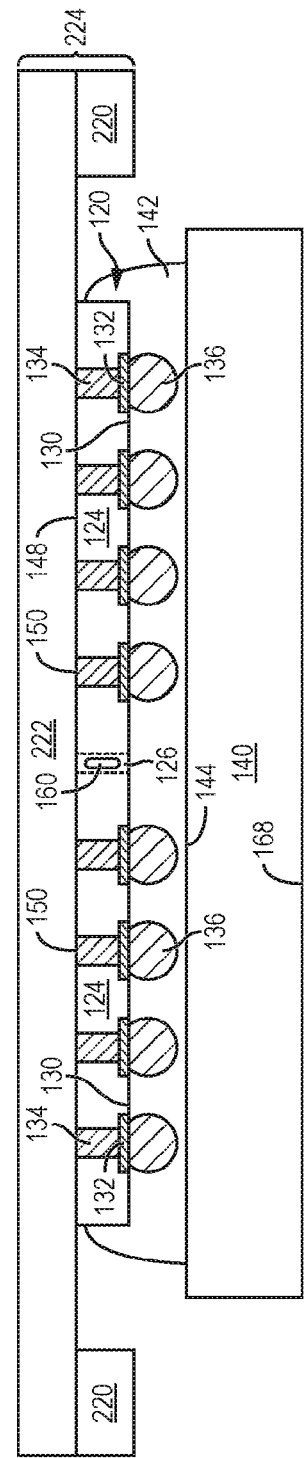

FIG. 6a, continuing from FIG. 3m or 3n, shows wafer ring 220 is mounted to mounting tape 222, and the combined mounting assembly 224 (wafer ring 220 and mounting tape 222) is positioned over back surface 148 of semiconductor die 120. Wafer ring 220 is a rigid structure including metal, glass, ceramic, or composite material. Mounting tape 222 is polyvinyl chloride, polypropylene, polyethylene, polyolefin, or other similar material. Mounting assembly 224 is mounted to back surface 148 of semiconductor wafer 120 with the semiconductor wafer disposed within wafer ring 220. Mounting assembly 224 provides structural support for the semiconductor wafer during subsequent manufacturing operations.

Carrier 140 is debonded or removed from adhesive 142 by chemical etching, mechanical peeling, CMP, mechanical grinding, thermal bake, UV light, laser scanning, or wet stripping to expose the adhesive.

Figure 6B:
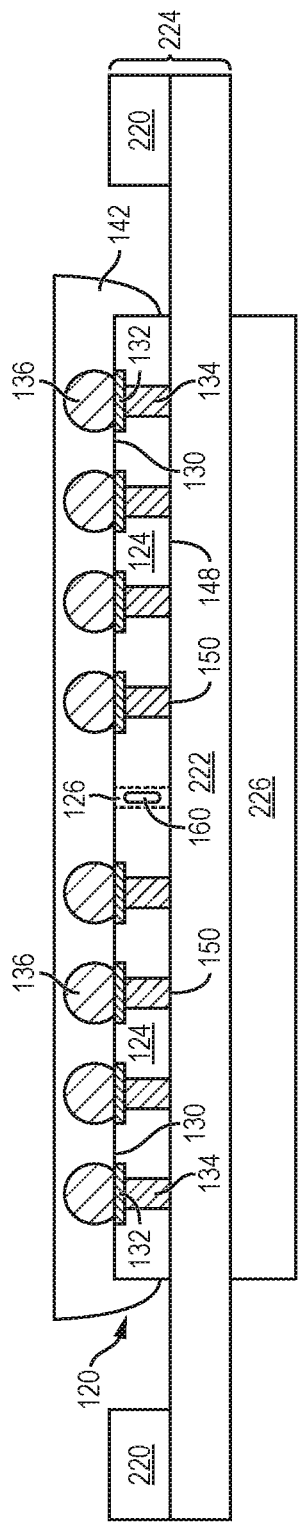

In FIG. 6b, semiconductor wafer 120 and mounting assembly 224 are positioned over and mounted to expansion table or jig 226 with mounting tape 222 oriented toward the expansion table or jig. Jig 226 includes a circular chuck or substrate or rigid ring with an outer diameter greater than or equal to the diameter of semiconductor wafer 120.

Figure 6C:
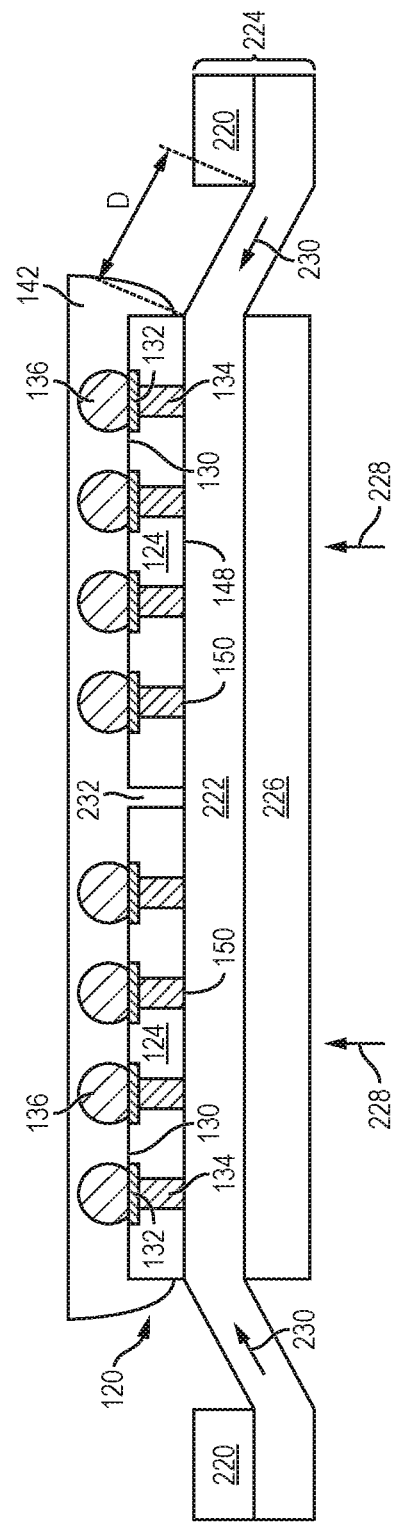

In FIG. 6c, semiconductor die 124 are singulated by moving jig 226 upward, as shown by arrows 228, while holding wafer ring 220 stationary. The movement of jig 226 relative to wafer ring 220 increases distance D and stretches or expands mounting tape 222, as shown by arrows 230. The stretching or expansion of mounting tape 222 creates stress in semiconductor wafer 120. The stress created in semiconductor wafer 120 by stretching or expanding mounting tape 222 causes modified region 160 to break, fracture, separate, or otherwise lose structural integrity. The separation or loss of structural integrity in modified region 160 singulates semiconductor wafer 120 into separate semiconductor die 124 with gap 232 between the semiconductor die. A pliability or malleability of adhesive 142 allows for separation between semiconductor die 124 and formation of gap 232 without damaging bumps 136.

In another embodiment, jig 226 is held stationary while wafer ring 220 moves downward to increase distance D and stretch or expand mounting tape 222. A downward-moving wafer ring 220 with an inner diameter greater than the diameter of jig 226 stretches or expands mounting tape 222 over the jig. Alternatively, neither wafer ring 220 nor jig 226 is stationary and both move in opposing directions to stretch or expand mounting tape 222. The stretching or expansion of mounting tape 222 creates stress in semiconductor wafer 120. The stress created in semiconductor wafer 120 by the stretching or expanding of mounting tape 222 causes modified region 160 to break, fracture, separate, or otherwise lose structural integrity. The separation or loss of structural integrity in modified region 160 singulates semiconductor wafer 120 into separate semiconductor die 124 with gap 232 between the semiconductor die. A pliability or malleability of adhesive 142 allows for separation between semiconductor die 124 and formation of gap 232 without damaging bumps 136. Jig 226 can heat mounting tape 222 to improve the elasticity of the mounting tape.

Figure 6D:
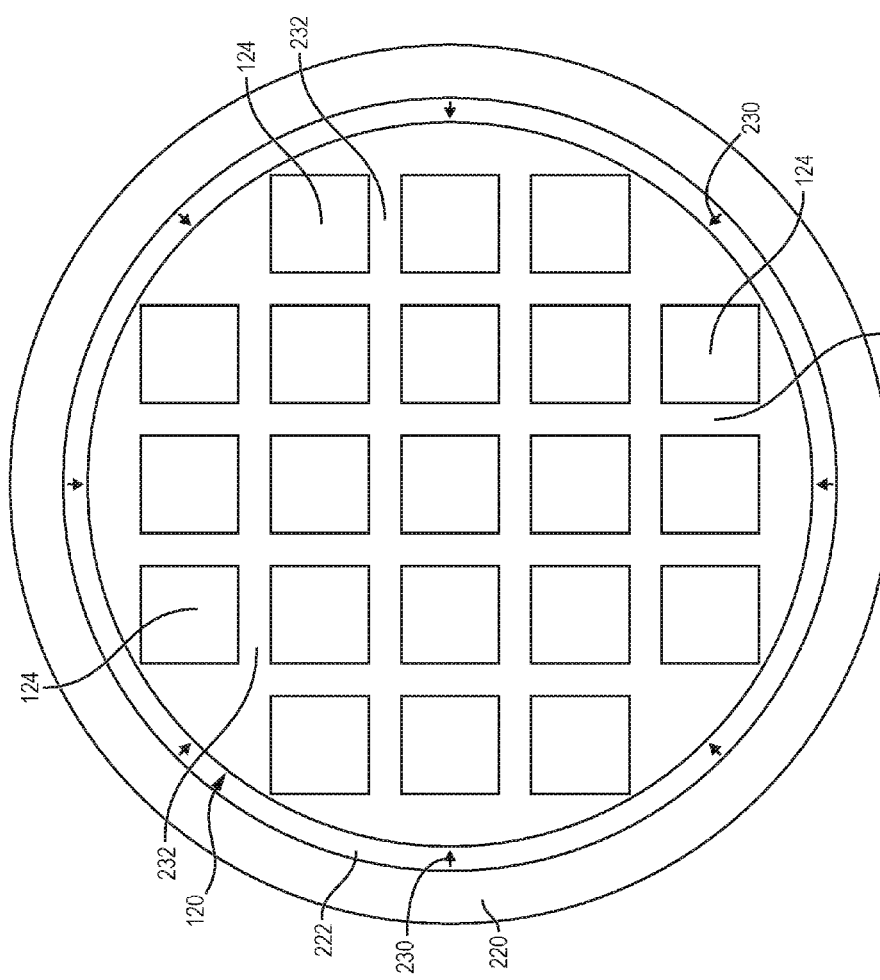
Figure 6E:
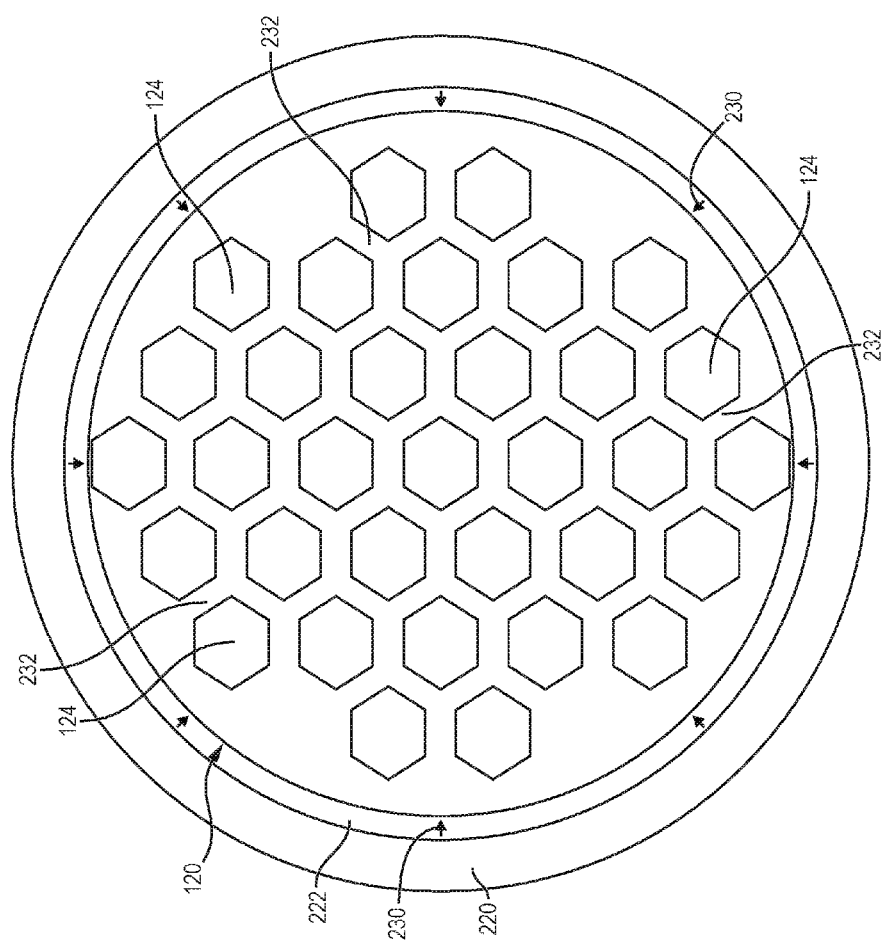

FIG. 6d is a plan view of semiconductor wafer 120 singulated into individual semiconductor die 124 by stretching mounting tape 222. FIG. 6e is a plan view of an embodiment of semiconductor wafer 120 singulated into individual hexagonal semiconductor die 124 by stretching mounting tape 222. During singulation, bumps 136 of semiconductor die 124 are protected by adhesive 142. Because adhesive 142 covers bumps 136 and active surface 130 of semiconductor die 124 until the semiconductor die are removed from tape 222 for subsequent handling, a risk of damaging the semiconductor die due to mishandling is reduced.

In FIG. 6f, adhesive 142 is peeled off or removed from singulated semiconductor wafer 120 and from around bumps 136 to expose active surface 130 of semiconductor die 124 and the bumps. Mounting assembly 224 and jig 226 optionally provide structural support for the removal of adhesive 142 while back surface 148 of semiconductor die 120 is still attached to mounting tape 222.

FIG. 6g shows back surface 148 of singulated semiconductor die 124 mounted to tape 222. Semiconductor die 124 are removed from mounting tape 222 in a pick and place operation for subsequent bonding or integration of semiconductor die 124 within additional packaging. Because semiconductor wafer 120 is singulated into individual semiconductor die 124 before removal of adhesive 142 and separation of semiconductor die 124 from mounting tape 222, bumps 136 are protected by the adhesive to reduce a risk of damaging the bumps. Additionally, a risk of damaging or breaking semiconductor wafer 120 due to mishandling after the wafer has been thinned by backgrinding is reduced because semiconductor wafer 120 remains attached to mounting tape 222 until after singulation of the semiconductor die. Furthermore, singulation of semiconductor die 124 before removal of adhesive 142 provides a cost effective process for reducing a risk of damaging or breaking semiconductor wafer 120, semiconductor die 124, active surface 130, and bumps 136 while providing increased functionality for handling thinned wafers during back-end assembly processes.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a carrier including an adhesive disposed over the carrier;
    providing a semiconductor wafer including a plurality of semiconductor die separated by a non-active region;
    forming a plurality of bumps over the semiconductor die;
    mounting the semiconductor wafer to the carrier with the adhesive disposed around the plurality of bumps;
    applying irradiated energy to the non-active region to form a modified region within the non-active region;
    singulating the semiconductor wafer along the modified region to separate the semiconductor die; and
    removing the adhesive from around the plurality of bumps after singulating the semiconductor wafer.

2. The method of claim 1, wherein singulating the semiconductor wafer along the modified region includes applying a temperature gradient across the semiconductor wafer.

3. The method of claim 1, wherein singulating the semiconductor wafer along the modified region includes applying mechanical stress to the semiconductor wafer.

4. The method of claim 1, further including removing a portion of the semiconductor wafer to thin the semiconductor wafer.

5. The method of claim 1, further including warming the adhesive before removing the adhesive from around the plurality of bumps.

6. The method of claim 1, wherein applying irradiated energy to the non-active region causes silicon material of the semiconductor wafer to melt and re-solidify as polysilicon.

7. A method of making a semiconductor device, comprising:
    providing a carrier including an adhesive disposed over the carrier;
    mounting a semiconductor wafer over the carrier with bumps of the semiconductor wafer embedded in the adhesive;
    applying irradiated energy to a non-active region of the semiconductor wafer to form a modified region; and
    singulating the semiconductor wafer along the modified region.

8. The method of claim 7, wherein applying irradiated energy to the non-active region causes silicon material of the semiconductor wafer to melt and re-solidify as polysilicon.

9. The method of claim 7, wherein singulating the semiconductor wafer along the modified region includes applying a temperature gradient across the semiconductor wafer.

10. The method of claim 7, wherein singulating the semiconductor wafer along the modified region includes applying mechanical stress to the semiconductor wafer.

11. The method of claim 7, further including mounting a tape to the semiconductor wafer opposite the adhesive before removing the adhesive.

12. The method of claim 7, further including forming the modified region as a plurality of vertically stacked modified regions.

13. The method of claim 7, further including providing the semiconductor wafer as a plurality of semiconductor die comprising through silicon vias.

* * * * *